(12) United States Patent
Ferrari et al.

(10) Patent No.: US 12,687,558 B2
(45) Date of Patent: Jul. 21, 2026

(54) DATA ACQUISITION DEVICE

(71) Applicant: EMAK S.P.A., Bagnolo in Piano (IT)

(72) Inventors: Marco Ferrari, Carpi (IT); Gianluca Barbolini, Modena (IT)

(73) Assignee: EMAK S.P.A., Bagnolo in Piano (IT)

(*) Notice: Subject to any disclaimer, the term of this patent is extended or adjusted under 35 U.S.C. 154(b) by 310 days.

(21) Appl. No.: 18/551,252

(22) PCT Filed: Mar. 16, 2022

(86) PCT No.: PCT/IB2022/052364
§ 371 (c)(1),
(2) Date: Sep. 19, 2023

(87) PCT Pub. No.: WO2022/200923
PCT Pub. Date: Sep. 29, 2022

(65) Prior Publication Data

US 2024/0210437 A1 Jun. 27, 2024

(30) Foreign Application Priority Data

Mar. 25, 2021 (IT) ........................ 102021000007301

(51) Int. Cl.
*G01P 3/66* (2006.01)
*G01P 1/02* (2006.01)
*G01R 33/028* (2006.01)

(52) U.S. Cl.
CPC ................ *G01P 3/66* (2013.01); *G01P 1/026* (2013.01); *G01R 33/028* (2013.01)

(58) Field of Classification Search
CPC .......... G01P 3/66; G01P 1/026; G01R 33/028
USPC ...................................................... 73/514.39
See application file for complete search history.

(56) References Cited

U.S. PATENT DOCUMENTS

| | | | | |
|---|---|---|---|---|
| 10,380,511 | B2 | 8/2019 | Mejegård et al. | |
| 10,845,435 | B2 | 11/2020 | Gurr et al. | |
| 2008/0227235 | A1 | 9/2008 | Theuss et al. | |
| 2010/0028765 | A1* | 2/2010 | Doege | H01M 10/6554 429/120 |
| 2018/0068493 | A1* | 3/2018 | Russ | G01H 11/08 |

FOREIGN PATENT DOCUMENTS

| | | | |
|---|---|---|---|
| EP | 3032640 | B1 | 3/2017 |

* cited by examiner

*Primary Examiner* — Nathaniel T Woodward
(74) *Attorney, Agent, or Firm* — FisherBroyles, LLP; Roger L. Browdy; Ronni S. Jillions

(57) ABSTRACT

A data acquisition device (1,1') for monitoring an operating parameter of a tool (5) provided with a motor is described, said device comprising: an electronic assembly (10) provided with a sensor (15) configured to wirelessly monitor a variable indicative of the operational parameter of the tool (5), a power supply battery (35) which powers the electronic assembly (10), and a casing (55,55') defining a housing seat (60) of the electrical power supply battery (35) and which is provided with an opening (65) for inserting the electrical power supply battery (35) into the housing seat, wherein the opening (65) is sealed by a layer of polymeric material (100,105).

8 Claims, 4 Drawing Sheets

DATA ACQUISITION DEVICE

TECHNICAL FIELD

The present invention relates to a data acquisition device for monitoring an operating parameter of a tool provided with a motor, in particular for gardening tools provided with a motor such as chainsaws, brushcutters, hedge trimmers, blowers, lawnmowers, etc.

PRIOR ART

Data acquisition devices for monitoring, and possibly storing in the device, a value indicative of an operating parameter of a tool provided with a (electric or endothermic) motor or even a plurality of values indicative of one or more operating parameters of the tool are known.

This operating parameter of the motor may, for example, be one of the number of hours of use, the working load of the motor, the number of motor revolutions in the unit time, i.e., the number of motor revolutions per minute (RPM), the motor oil temperature, whether the motor is on or off, the ambient temperature, the vibration intensity of the tool (possibly cross-referenced with the number of hours of use to indicate to the operator to have a break), the geographical position data of the tool, the speed at which the tool is moving, the position of the throttle valve in the case of an endothermic motor, the real-time condition of a brake between applied and not applied, the presence or absence of a cutting tool operationally connected to a motor-driven PTO, the fuel consumption in the case of an endothermic motor, the battery charge level in the case of an electric motor, the tool tilt value, the acceleration values of a drive shaft, the operating pressure, the presence of shocks, the status of the tool functions, the ambient humidity, the presence of other tools in the vicinity, the fuel level in the case of an endothermic motor, etc. . . . .

Monitoring the value indicative of the operating parameter is typically performed by an electronic assembly provided with a sensor configured to monitor wirelessly, i.e., without a direct connection to the motor of the tool or electronic tool control devices, in practice without a galvanic connection to the tool components, a variable indicative of the operating parameter of the tool.

The data acquisition devices are portable devices that can be installed aftermarket on the tool, therefore made separately from the tool (in a body that is distinct, independent and separate from the tool) and that must therefore be provided with its own power supply battery to power the electronic assembly.

These devices comprise a casing, which is made separately from the tool (i.e., which is not part of a casing of the tool or in other words, which is made as a body that is distinct, independent and separate from the tool) that contains within it and protects the battery and the electronic assembly, usually in two respective housing seats made available by the casing.

In particular, the housing seat of the battery comprises an opening, for inserting the battery into the housing seat, which is closed by means of a cap removably associated with the casing, for example screwed to the casing or fixed to the casing by a snap-on mechanism.

In order to prevent water from entering the housing seat of the battery, the device comprises one or more sealing gaskets configured to generate a hermetic seal between the cap and the casing.

One problem with such a solution is that the data acquisition device, hence its casing, is bulky due to the need to make the means for the removable fixing of the cap (e.g., a thread or seats for hooks/hooks at the opening of the housing seat), as well as the presence of the necessary space for the sealing gaskets of the cap.

An object of the present invention is to make available an acquisition device for monitoring an operating parameter of a tool that is more compact than the devices of the prior art and at the same time robust and water resistant, as well as faster to manufacture.

Such object is achieved by the features of the invention indicated in the independent claim. The dependent claims outline preferred and/or particularly advantageous aspects of the invention.

DISCLOSURE OF THE INVENTION

In particular, the invention makes available a data acquisition device for monitoring an operating parameter of a tool provided with a motor, said device comprising:

- an electronic assembly provided with a sensor configured to wirelessly monitor a variable indicative of the tool operating parameter,
- a power supply battery which powers the electronic assembly,
- a casing defining a housing seat of the battery and which is provided with an opening for inserting the battery into the housing seat, wherein the opening is sealed by a layer of polymeric material.

Thanks to such a solution, the data acquisition device protects the battery from shocks and water/humidity and at the same time results in being more compact than devices of the prior art, this by virtue of the fact that it does not comprise a cap/cover removably associated with the casing to close the opening of the housing seat and therefore in the casing there must be neither means for allowing the cap to be removably fixed to the casing, nor seats for the sealing gaskets that make the housing seat hermetically sealed when the cap is in place. Thus, it can be said, in other words, that the layer of polymeric material is substantially a polymeric material cap that is non-removably fixed to the casing to occlude the opening of the housing seat and seal the power supply battery within it. Since the means and seats for the gaskets occupy space, the device according to the invention is more compact. Furthermore, making such means and seats requires a complication in design and/or production, therefore the device according to the invention is faster to design and/or manufacture.

According to a first embodiment of the invention, said layer of polymeric material is a resin layer.

This makes the data acquisition device particularly simple and fast to design, as well as easy to manufacture.

According to a second embodiment of the invention, the layer of polymeric material is a portion of the casing, said casing being made in a monolithic body incorporating within it the battery.

This variant, compared to the one with resin, is more complicated in terms of the design of the mould of the casing, but does not require any subsequent assembly steps following the casing moulding step (which in practice is a co-moulding/overmoulding of the casing with the battery inside)

In other words, the invention makes available a data acquisition device for monitoring an operating parameter of a tool provided with a motor, said device comprising:

- an electronic assembly provided with a sensor configured to wirelessly monitor a variable indicative of the tool operating parameter,
- a power supply battery which powers the electronic assembly,
- a casing, e.g. of polymeric material, shaped as a closed box body, e.g. monolithic (made by solidification of a single material), which closes and seals within it the battery, and e.g. the electronic assembly, in a housing seat defined by the box body.

Regardless of the embodiment of the casing, i.e., the layer of polymeric material, the housing seat can be shaped as a cup so that both the battery and the provided electronic assembly are contained within it. In this case, the electronic assembly is also sealed within the housing seat by the layer of polymeric material.

This feature makes the data acquisition device even more compact because it is not necessary to make a separate seat in the casing for the housing of the electronic assembly.

Again irrespective of the embodiment of the casing, the electronic assembly may comprise an electronic board, on which the sensor is installed and which is directly interposed between the battery and the layer of polymeric material and contacts the battery and the layer of polymeric material.

Thanks to this solution, it is possible to hold both the battery and the electronic assembly in place without the need for elastic elements inside the housing seat, such as foil springs or foam elements.

According to another aspect of the invention, the electronic board may comprise a flat plate for fixing the sensor so that it protrudes from a face of the flat plate opposite the power supply battery, and wherein the sensor is embedded in the layer of polymeric material.

In particular, the electronic assembly may comprise a plurality of electronic components, of which the sensor is also a part, and an electronic component fixing plate to which the electronic components are fixed so that they protrude from a face of the plate opposite the power supply battery, and in which said electronic components are embedded in the layer of polymeric material This prevents any movement of the electronic assembly in the casing The invention also makes available a method for making a data acquisition device for monitoring an operating parameter of a tool provided with a motor, according to the first embodiment. Said method comprises the following steps:

- providing the power supply battery,
- providing a casing defining a housing seat, which is suitable for housing the power supply battery and is provided with an opening for inserting the battery into the housing seat,
- providing an electronic assembly with a sensor configured to wirelessly monitor a variable indicative of the tool operating parameter,
- associating the electronic assembly with the casing,
- inserting the power supply battery into the housing seat,
- depositing a layer of polymeric material on the opening by sealing the battery in the housing seat.

With such a solution, a fast and practical method for making a data acquisition device that is more compact than devices of the prior art is made available.

According to one aspect of the invention, said material, the polymeric material, is a resin.

However, it is not excluded that in an alternative embodiment not shown, the polymeric material may be a non-resinous plastic material, for example equal to a polymeric material of which the casing is made that is added for example during a moulding step following the insertion of the battery into the housing seat of the casing.

The invention also makes available a method for making a data acquisition device for monitoring an operating parameter of a tool provided with a motor, according to the second embodiment. Said method comprises the following steps:

- providing a power supply battery,
- providing a mould for moulding a polymeric material shaped so as to make a casing defining a housing seat of the battery,
- inserting the battery into the mould,
- injecting the polymeric material into the mould by making a casing provided with a housing seat of the battery, within which the battery is sealed by a layer of the polymeric material injected into the mould.

The invention also makes available a further method for making a data acquisition device for monitoring an operating parameter of a tool provided with a motor, according to the second embodiment. Said method comprises the following steps:

- providing a power supply battery,
- providing an electronic assembly with a sensor configured to wirelessly monitor a variable indicative of the tool operating parameter,
- providing a mould for moulding a polymeric material shaped so as to make a casing defining a housing seat of the battery,
- inserting the battery and the electronic assembly into the mould,
- injecting the polymeric material into the mould by making a casing provided with a housing seat for the battery and the electronic assembly, within which the battery and the electronic assembly are sealed by a layer of the polymeric material injected into the mould.

The invention also makes available the use of a data acquisition device according to claim 1 for monitoring an operating parameter of a tool provided with a motor.

The invention also makes available the use of a data acquisition device according to claim 1 for monitoring an operating parameter of the motor of a tool provided with a motor.

The invention also makes available a kit for gardening comprising a tool for gardening and a data acquisition device according to claim 1.

BRIEF DESCRIPTION OF THE DRAWINGS

Further characteristics and advantages of the invention will become clear from reading the following description provided by way of non-limiting example, with the aid of the figures illustrated in the accompanying tables.

BEST MODE OF THE INVENTION

Figure 1:
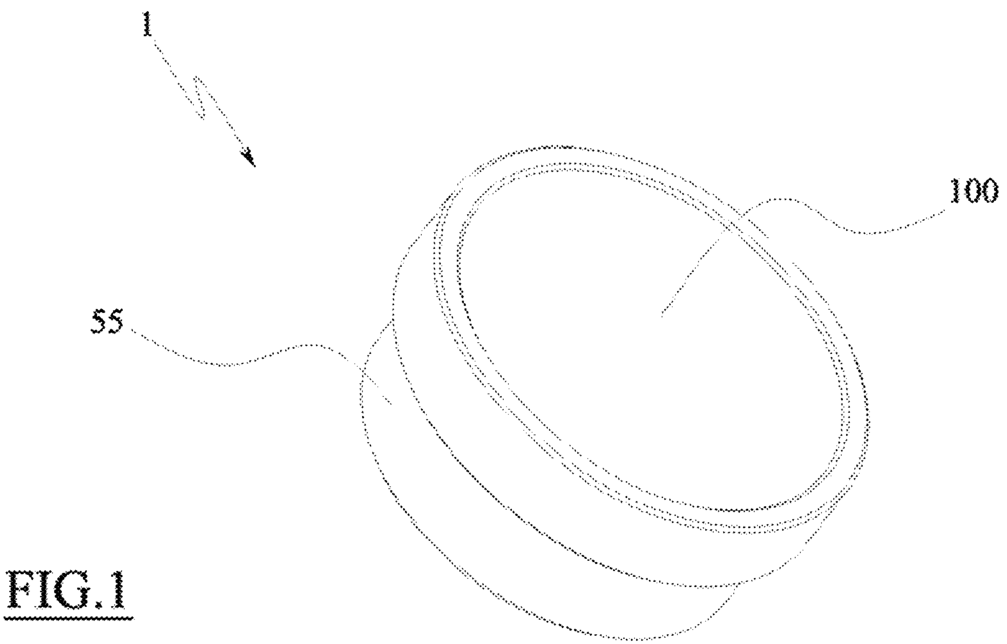
FIG. 1 is an axonometric view of a data acquisition device according to an embodiment of the invention.

With particular reference to said figures, a data acquisition device, in particular of a portable type, for monitoring an operating parameter of a tool, specifically for gardening, provided with a motor for driving the tool has been globally indicated by 1,1'. In the following, the data acquisition device 1,1' will be abbreviated as the device 1,1'.

The operating parameter may, for example, be one of the number of hours of use, the working load of the motor, the number of motor revolutions in the unit time, i.e., the number of motor revolutions per minute (RPM), the motor oil temperature, whether the motor is on or off, the ambient temperature, the vibration intensity of the tool (possibly cross-referenced with the number of hours of use to indicate to the operator to have a break), the geographical position data of the tool, the speed at which the tool is moving, the position of the throttle valve in the case of an endothermic motor, the real-time condition of a brake between applied and not applied, the presence or absence of a cutting tool operationally connected to a motor-driven PTO, the fuel consumption in the case of an endothermic motor, the battery charge level in the case of an electric motor, the tool tilt value, the acceleration values of a drive shaft, the operating pressure, the presence of shocks, the status of the tool functions, the ambient humidity, the presence of other tools in the vicinity, the fuel level in the case of an endothermic motor, etc. . . . .

Preferably, the operating parameter is at least one between the number of hours of use, the working load of the motor, the number of motor revolutions in the unit time, i.e., the number of motor revolutions per minute (RPM), whether the motor is on or off, the vibration intensity of the tool (possibly cross-referenced with the number of hours of use to indicate to the operator to have a break), the position of the throttle valve in the case of an endothermic motor, the battery charge level in the case of an electric motor, the acceleration values of a drive shaft.

In other words, the operating parameter is preferably an operating parameter of the motor of the tool.

More preferably, the operating parameter, i.e. of the motor of the tool, is at least one between whether the motor is on or off and the number of motor revolutions in the unit time, i.e., the number of motor revolutions per minute (RPM).

The tool may, for example, be one of a chainsaw, a brushcutter, a hedge trimmer, a blower, a lawnmower, or a walking tractor; preferably is at least one between a chainsaw, a brushcutter, a hedge trimmer and a blower. In the figures, for illustrative purposes only, a blower 5 is shown.

The motor of the tool can be either an endothermic motor or an electric motor.

Such tools generally comprise one or more enclosures covering certain components of the tool, in particular covering at least part of the motor.

The device 1,1' is suitable for being fixed, e.g. by means of threaded connecting parts or clamping systems or quick release systems or adhesives, to said enclosure.

Alternatively, the device may be inserted into a pocket of a user's clothing, or it may be part of a wearable item, such as a necklace or wristband.

Regardless of the positioning of the device 1,1', it comprises an electronic assembly 10, which is provided with a sensor 15 configured to wirelessly, i.e., contactlessly, monitor a variable indicative of the tool operating parameter.

For example, the sensor 15 may be one of an inductive sensor, a capacitive sensor, an acoustic sensor, a vibration sensor, or a combination of multiple types of sensors. Preferably the sensor is at least one between an inductive sensor and a capacitive sensor. Even more preferably the sensor is a inductive sensor.

The inductive sensor and the capacitive sensor are preferably use for measuring operative parameters of the motor of the tool, particularly of the endothermic motor. As is known, such sensors can be configured (i.e. the data acquisition device can be configured to measure by means of such sensors) to measure the electromagnetic field variations generated by the passage of the current necessary for the generation of a spark in a combustion chamber of the engine. endothermic and/or the current generated by magnets present in a free wheel of the endothermic motor. Variations in the electromagnetic field can be used to measure the number of motor revolutions per unit of time or simply to detect whether the motor is on or off.

The electronic assembly 10 may further comprise an electronic control and command unit operatively (and galvanically) connected to the sensor and a transmitter, or transceiver, operatively (galvanically) connected to the electronic control and command unit.

The electronic assembly 10 may further comprise a memory operatively (galvanically) connected to the electronic control and command unit, preferably of the volatile type. The reason why memory is volatile will be clearer in the following.

In detail, the electronic assembly may comprise, or be constituted by, an electronic board (or in other words a printed circuit board) on which the sensor is installed. For example, the electronic control and command unit, the transmitter device and the memory are also installed on it.

The electronic board comprises a flat plate 20, made of a non-conductive material, to which the sensor 15 is fixed and from which the sensor 15 protrudes (the same applies for the control and command electronic unit, the transmitter device and the memory). For example, the flat plate 20 is provided with a first face 25 and an opposite second face 30 and the sensor protrudes from the second face 30 (the same applies for the control and command electronic unit, the transmitter device and the memory). Preferably, a conductive surface of the electronic board is arranged on the first face 25, for example forming part of a resilient electrical contact protruding from the first face 25 or made as a layer of conductive material adhering to the first face 25 of the flat plate 20. Said conductive surface is electrically connected at least to the sensor, preferably also to the electronic control and command unit, the transmitter and the memory.

The device 1,1' comprises a power supply battery 35 (hereinafter abbreviated as battery 35), for example discoidal (button) shaped, which electrically powers the electronic assembly 10. Preferably, there is a single battery 35 in the device which is the only source of electrical power for the electronic assembly.

In the illustrated embodiment, the battery comprises a first flat face 40 and an opposite second flat face 45, for example joined by an annular side surface 50.

The device 1 also comprises a casing 55,55' e.g. made of a polymeric material, which defines a housing seat 60 of the battery 35, e.g. in which the battery is totally accommodated, and which is provided with an opening 65 for inserting the battery into the housing seat.

The housing seat 60 is shaped to accommodate the battery 35 to size, i.e., it is shaped so that the annular side surface 50 is accommodated to size in the housing seat.

In the illustrated embodiment, the housing seat 60 is shaped like a cup and comprises a bottom surface 70, e.g. circular and flat (i.e. shaped like the first flat face 40 of the battery 35), from the perimeter of which a side surface 75, e.g. cylindrical, of the housing seat develops (directly) in the direction of the opening 65.

When the battery is inserted into the housing seat 60, its first flat face 40 is in contact with the bottom surface 70 and its annular side surface 50 is inserted in the side surface 75 to size.

In addition, the electronic assembly 10 is preferably also inserted in the housing seat 60. For example, the battery 35 is interposed (and directly in contact) between the bottom surface 70 and the electronic assembly. In particular, the battery 35 is in contact with the bottom surface 70 with the first flat face 40 and the electronic assembly 10 with the second flat face 45. The second flat face 45 is therefore in contact with the electrical contact of the electronic board, thus of the first face of the flat plate 20.

It is not excluded that in an alternative embodiment it is the electronic board that is interposed between the bottom surface and the battery. Nor is it excluded that in an alternative embodiment the electronic board may be housed in a respective seat made in the casing, but that is distinct from the housing seat of the battery.

In a non-illustrated embodiment, the battery and the electronic board form a single body, in particular the battery is welded (e.g., tin welded) to the electronic board in order to power the components thereof. In such a case, the electronic board preferably comprises a switch operable between a power-on position, in which it allows powering the electronic board via the battery, and a power-off position, in which it electrically isolates the battery from the electronic board preventing the electronic board from being powered via the battery. In this case the switch is brought into the power-on position from the power-off position, only when (as will become clearer in the following) one is about to assemble the data acquisition device.

In order to also contain (e.g., entirely) the electronic assembly in the housing seat, in the illustrated embodiment, the housing seat 60 comprises an enlarged portion developing from the opening 65 towards the bottom surface 70, substantially enlarging the side surface 75.

In particular, the enlarged portion comprises a stop surface 80 facing the opening and on which the electronic assembly rests, in detail on which the first face of the flat plate of the electronic board rests.

Basically, the stop surface 80 forms with the side surface 75 an annular step on which the electronic assembly, i.e., the circuit board, rests.

When the electronic assembly is in contact with the stop surface, the battery is isolated from the opening 65. In practice, the battery is entirely contained in a volume defined by the bottom surface, the side surface and the first face of the flat plate of the electronic board.

In the illustrated embodiment, the stop surface 80 is shaped like an annular surface, for example flat and parallel to the bottom surface, which delimits the side surface 75 in the direction of approach to the opening and developing in the casing in the direction away from a central axis of the housing seat.

The enlarged portion then comprises a cylindrical surface 85 developing directly from a peripheral perimeter of the distal stop surface from the centre of the housing seat and extending up to the opening 65. Substantially, in the illustrated embodiment, in which the enlarged portion is present, the opening 65 is defined by the cylindrical surface 85. For example, the casing 55,55' is shaped like a discoidal body provided with a wall with constant thickness around the housing seat. Therefore, in the case where the housing seat features the enlarged portion, the casing is shaped externally like two disks of different diameters in contact with each other.

The casing 55,55' is preferably made (entirely) by injection of a thermoplastic or thermosetting material into a mould.

The opening 65 of the casing 55,55' is sealed by a layer of polymeric material (hereinafter abbreviated layer) that entirely occludes it. In particular, the layer adheres to the casing (in a non-removable manner, i.e., in a manner that cannot be removed without damaging the device) and holds the battery in place in the housing seat.

From the sealing of the battery in the casing 55,55' it follows that it cannot be extracted for replacement, so the battery is generously sized so as to have a high service life, substantially equal to the maximum service life of the entire device. As a result, the memory of the electronic assembly can be of the volatile type, as the power supply will never fail.

In the embodiment in which the electronic assembly is present in the housing seat and the battery is placed between the bottom surface 70 and the electronic assembly, the layer holds the electronic assembly and consequently the battery in place in the housing seat.

In practice, the casing comprises, that is, it is constituted by, a first portion comprising the housing seat 60 and the opening 65, and a second portion comprising, that is, it is constituted by, the layer of polymeric material and is fixed in a non-removable manner, for example glued (or welded) to the first portion by closing and sealing the opening thereof so as to hold the battery, and possibly also the electronic assembly, in place inside the housing seat 60.

The layer of polymeric material may have a thickness such as to embed within it the electronic components (hence at least the sensor, preferably also electronic control and command unit, transmitter and memory) that protrude from the second face of the flat plate of the electronic board.

In the preferred embodiment, the layer occupies almost the entire enlarged portion of the housing seat not yet occupied by the electronic assembly.

For example, the layer has a minimum thickness of not less than 2 mm.

Figure 2:
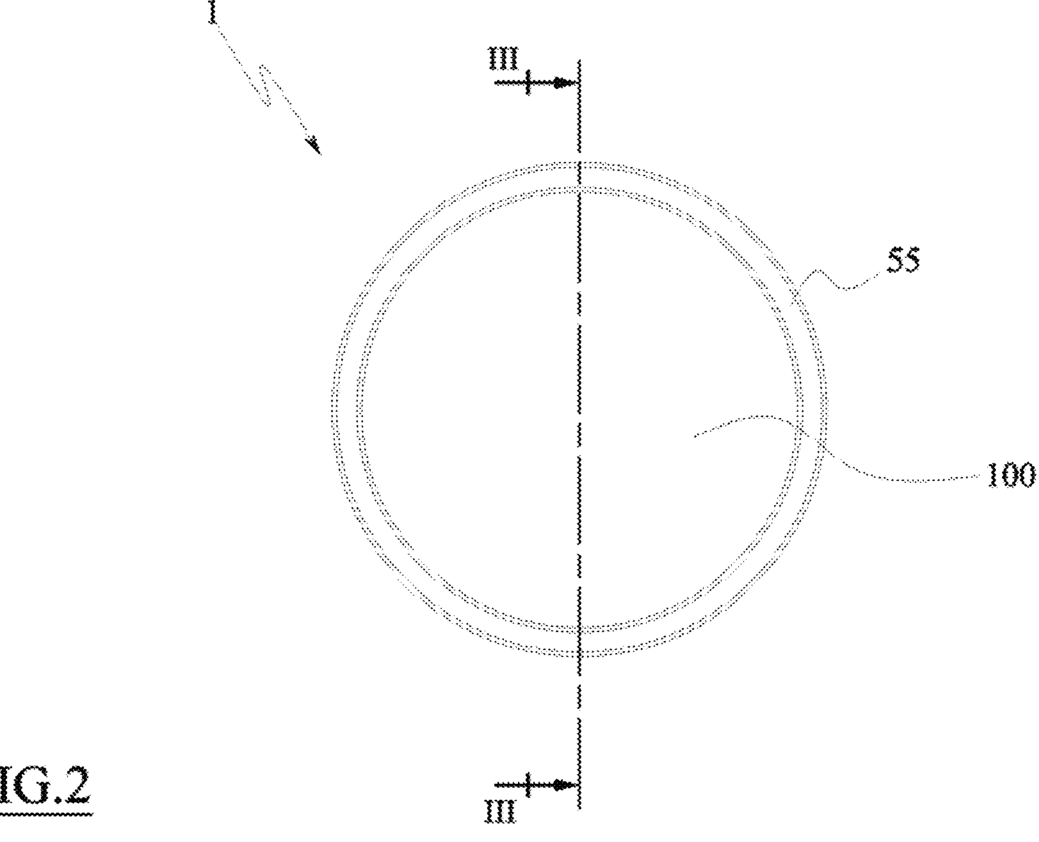
FIG. 2 is a front view of the device of FIG. 1.
Figure 3:
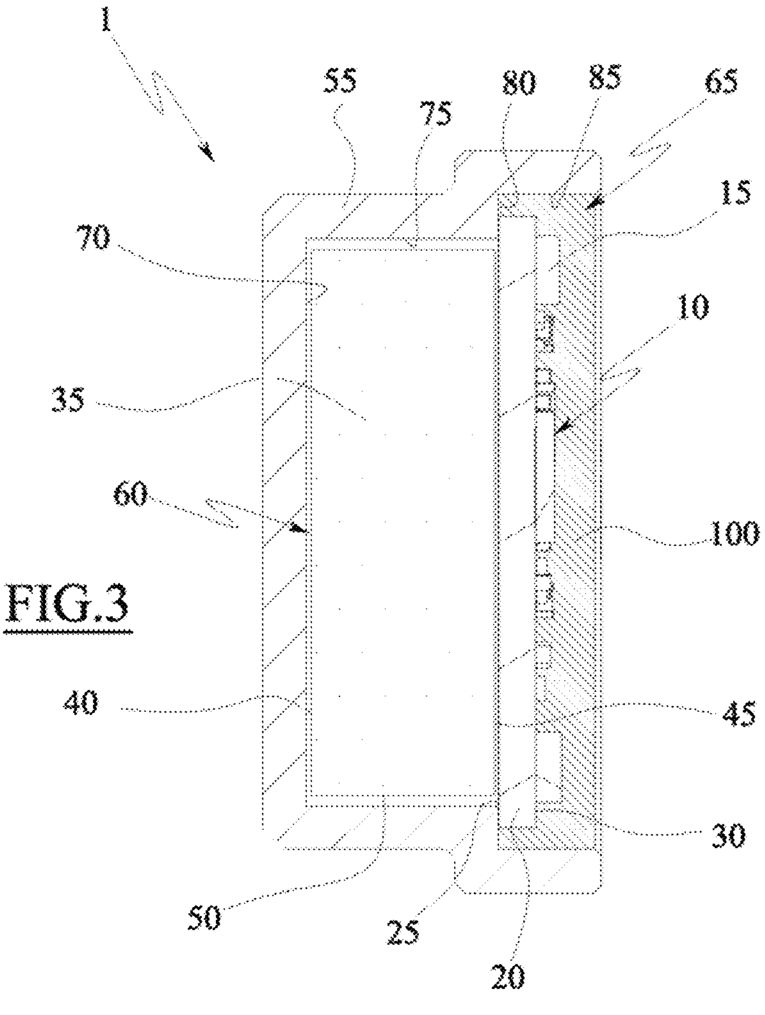
FIG. 3 is a sectional view of the device of the previous figures according to the plane of section III-III.

In a first illustrated embodiment of the device, shown in FIGS. 1 to 3, the layer, i.e., the second portion of the casing, is entirely formed by a layer of resin 100 that is glued to the casing 55 by filling a portion of the housing seat 60 at the opening 65, for example by filling the enlarged portion of the housing seat not yet occupied by the electronic assembly.

The resin is for example an artificial resin, preferably a resin that hardens when subjected to heat or UV light or air.

In this embodiment, the device 1 substantially comprises a resin cap (which is the second portion of the casing) that entirely seals the opening 65 by closing within the housing seat 60 the battery 35, and for example also the electronic assembly.

A method for making the device 1 illustrated in FIGS. 1-3 comprising the following steps:

- providing a power supply battery 35,
- providing a casing 55 defining a housing seat 60, which is suitable for housing the power supply battery and is provided with an opening 65 for inserting the battery into the housing seat,
- providing an electronic assembly 10 provided with a sensor configured to wirelessly monitor a variable indicative of the tool operating parameter,
- associating the electronic assembly 10 with the casing 55,
- inserting the power supply battery 35 into the housing seat 60, depositing a layer of polymeric material, i.e., a layer of resin 100, on the opening sealing the battery 35 in the housing seat.

During the step of depositing the layer of polymeric material, the polymeric material, i.e., the resin, is in a liquid state, and a subsequent step of hardening the layer of polymeric material is therefore provided in order to solidify the layer.

In the illustrated embodiment, in which the electronic assembly 10 is placed within the housing seat, the method includes, prior to the step of depositing the layer of polymeric material, associating the electronic assembly 10 with the casing 55 by inserting it into the housing seat 60, for example after inserting the power supply battery into said housing seat.

If the electronic assembly 10 is not within the housing seat in which the battery is inserted, an electrical connecting cable/contact (not shown) may be provided starting from the battery 35 and exiting from the casing through the opening. In this way, after having deposited the layer of resin, it will be possible to power the electronic assembly by connecting to said electrical connecting cable/contact and, for example, fixing or gluing the electronic assembly to the casing 55.

Figure 4:
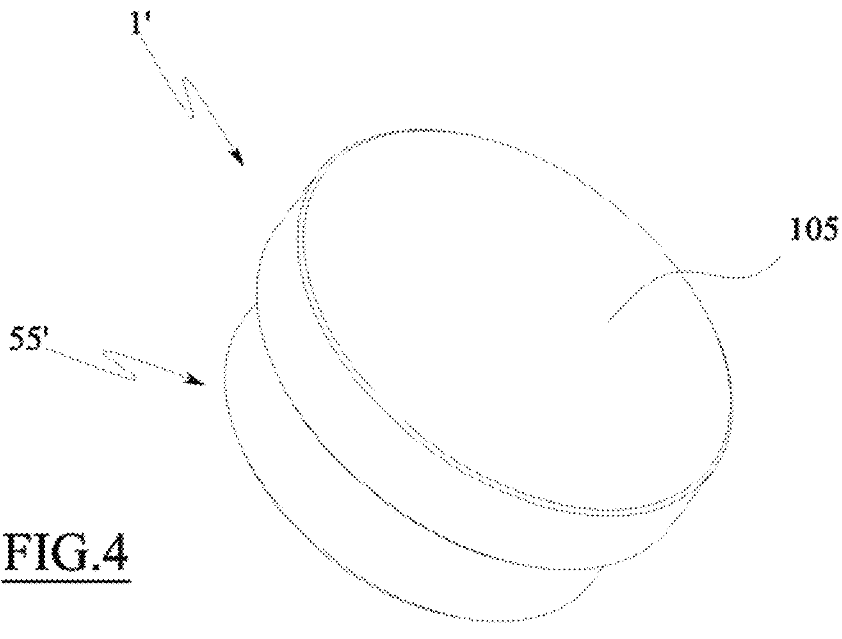
FIG. 4 is an axonometric view of a data acquisition device according to another embodiment of the invention.
Figures 5, 6:
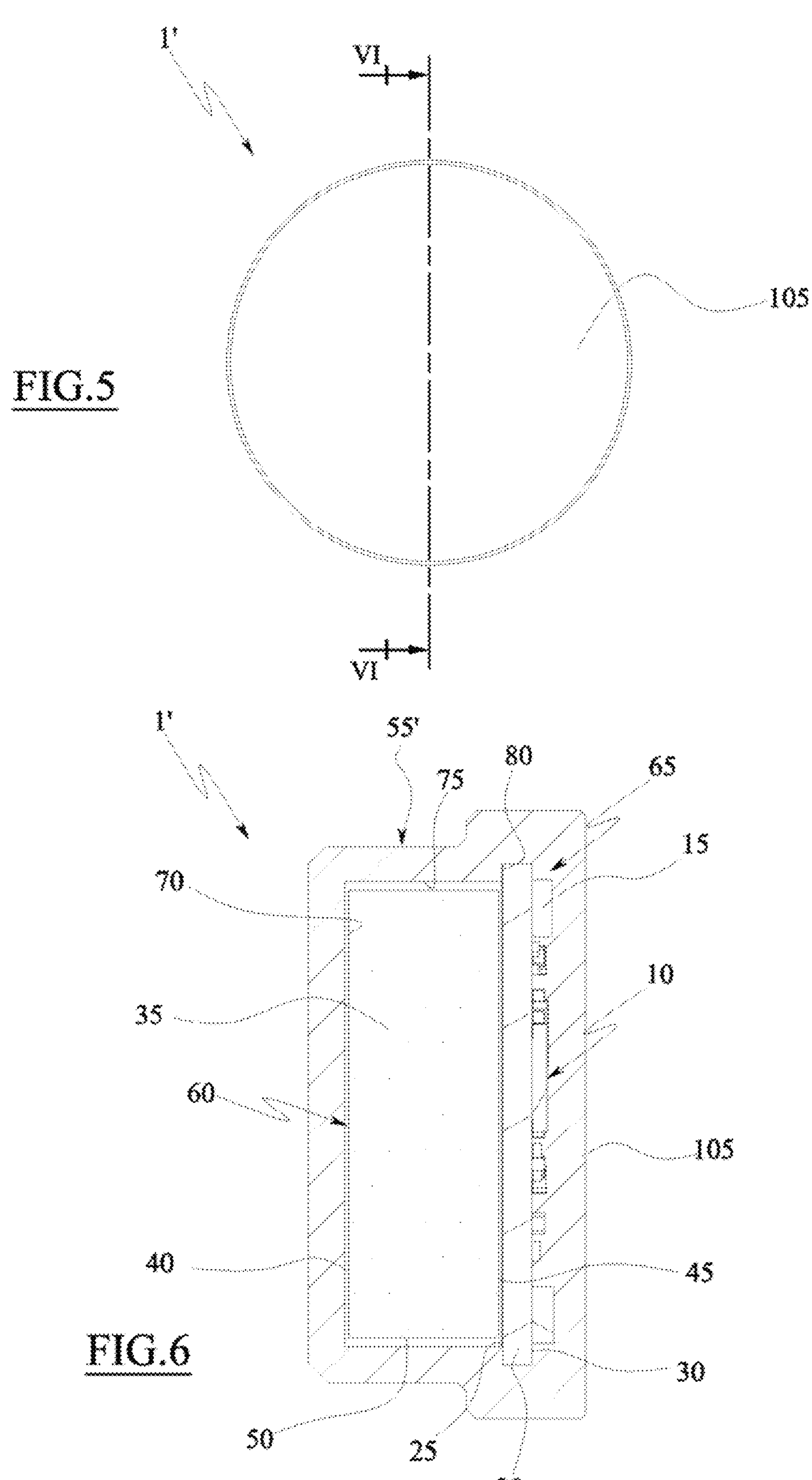
FIG. 5 is a front view of the device of FIG. 4.
FIG. 6 is a sectional view of the device of FIGS. 4 and 5 according to the plane of section VI-VI.
Figure 7:
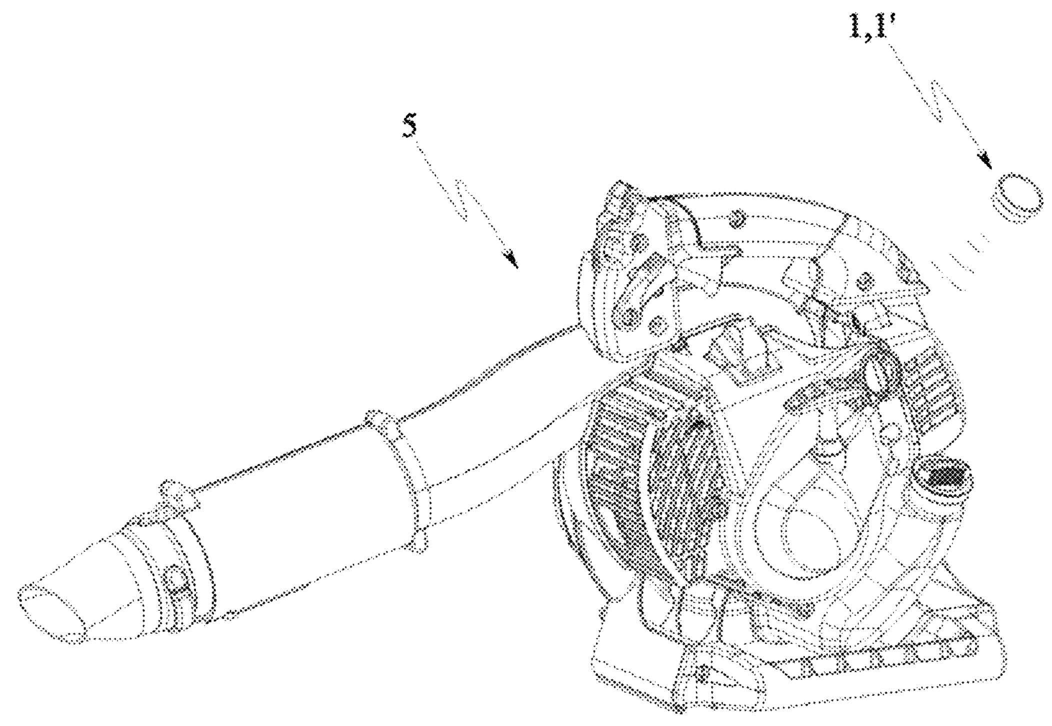
FIG. 7 is an axonometric view of the device in use.

FIGS. 4-6 illustrate an alternative embodiment of the device, indicated as 1', in which the layer of polymeric material is a portion 105 of the casing 55'. The layer of polymeric material is therefore of the same polymeric material of which the casing 55' is made.

For example, the casing may be made as a monolithic body (by cooling a single amount of molten polymeric material) that embeds within it the battery 35, and for example also the electronic assembly 10.

Essentially, the casing 55' of the device 1' is made by co-moulding with the battery. This technique is also known as over-moulding.

A method for making the device 1' illustrated in FIGS. 4-6 comprising the following steps:

providing a power supply battery 35, providing a mould for moulding polymeric material, inserting the power supply battery 35 into the mould, injecting the polymeric material into the mould by making a closed casing 55' around the battery, i.e., co-moulding (or overmoulding) the casing with the battery 35, cooling the casing and then extracting it out of the mould.

The method may further include providing an electronic assembly 10 provided with a sensor configured to wirelessly monitor a variable indicative of the operating parameter of the tool inside the mould along with the battery, prior to injecting the polymeric material. Or an electrical connecting cable/contact can be inserted inside the mould which is in galvanic connection with the battery and which after the injection of material protrudes externally from the casing so that it can be connected to an electronic assembly which is associated after moulding the casing with the battery.

In a further non-illustrated embodiment, the device and related manufacturing method may be like those of the device illustrated in FIGS. 1 and 3, but the polymeric material of the layer is any polymeric material excluding resin, preferably it is the same polymeric material as the casing. In practice, after having made the casing with the housing seat and having inserted at least the battery, a layer of this polymeric material, which is not a resin, is deposited on the opening.

The operation of the device 1,1' according to the invention is as follows.

The device is brought near the motor of the tool to be monitored (in order to monitor an operative parameter of said motor), either by attaching to the enclosure of the tool or by holding it on one's wrist using a wristband. Using the sensor, the device processes data, which are saved in the device's memory and can be sent to a remote device via the transmitter device.

The invention thus conceived is susceptible to several modifications and variations, all falling within the scope of the inventive concept.

Moreover, all details can be replaced by other technically equivalent elements.

In practice, the materials used, as well as the contingent shapes and sizes, can be whatever according to the requirements without for this reason departing from the scope of protection of the following claims.

The invention claimed is:

1. A method comprising monitoring an operating parameter of a gardening tool provided with a motor, using a data acquisition device comprising:

an electronic assembly provided with a sensor configured to contactlessly monitor a variable indicative of the operating parameter of the tool, wherein the operating parameter is at least one between whether the motor is on or off and the number of motor revolutions in the unit time, a single battery which is the only source of electrical power for the electronic assembly, a casing defining a housing seat of the power supply battery and which is provided with an opening for inserting the power supply battery into the housing seat, wherein the opening is sealed and entirely occluded by a non-removable layer of polymeric material in a manner that cannot be removed without damaging the device and holds the battery in place in the housing seat.

2. A method according to claim 1, wherein the sensor is an inductive sensor or a capacitive sensor.

3. The method according to claim 2, wherein the sensor is the inductive sensor, configured to measure the electromagnetic field variations generated by the passage of the current necessary for the generation of a spark in a combustion chamber of an endothermic motor and/or the current generated by magnets present in a free wheel of an endothermic motor.

4. A method according to claim 1, wherein the layer of polymeric material is a resin layer (100).

5. The method according to claim 1, wherein the housing seat is shaped like a cup and both the power supply battery and the electronic assembly are contained within it, and wherein the electronic assembly is also sealed within the housing seat by means of the layer of polymeric material.

6. The method according to claim 5, wherein the electronic assembly comprises an electronic board, on which the sensor is installed, and which is directly interposed between the electrical power supply battery and the layer of polymeric material and contacts the electrical power supply battery and the layer of polymeric material.

7. The method according to claim 6, wherein the electronic board comprises a flat plate for fixing the sensor so that it protrudes from a face of the flat plate opposite the power supply battery, and wherein the sensor is embedded in the layer of polymeric material.

8. The method comprising monitoring an operating parameter of a tool provided with a motor, using a data acquisition device comprising:

an electronic assembly provided with a sensor configured to wirelessly monitor a variable indicative of the tool operating parameter, wherein the operating parameter is at least one between whether the motor is on or off and the number of motor revolutions in the unit time, a single battery which is the only source of electrical power for the electronic assembly, and a casing of polymeric material shaped as a monolithic closed box body which closes and seals within it the battery in a housing seat defined by the closed box body.

* * * * *